United States Patent
Gopinathan et al.

[11] Patent Number: 5,498,982
[45] Date of Patent: Mar. 12, 1996

[54] HIGH SPEED COMPARATOR WITH A PRECISE SAMPLING INSTANT

[75] Inventors: Venugopal Gopinathan; Martin J. Izzard, both of Dallas, Tex.

[73] Assignee: Texas Instruments Incorporated, Dallas, Tex.

[21] Appl. No.: 374,866

[22] Filed: Jan. 19, 1995

Related U.S. Application Data

[63] Continuation-in-part of Ser. No. 282,686, Jul. 29, 1994, abandoned.

[51] Int. Cl.$^6$ ............................................. H03K 19/086
[52] U.S. Cl. ........................... 326/126; 326/93; 327/52
[58] Field of Search ................................. 326/124, 125, 326/126, 127, 115, 93; 327/52, 65

[56] References Cited

U.S. PATENT DOCUMENTS

| | | | |
|---|---|---|---|
| 4,810,908 | 3/1989 | Suzuki et al. | 326/126 |
| 5,065,050 | 11/1991 | Fernandez | 326/126 |
| 5,329,189 | 7/1994 | Ushida et al. | 327/65 |

FOREIGN PATENT DOCUMENTS 60-103727  6/1985  Japan ........................ 326/126

OTHER PUBLICATIONS

Underwood; "Cascode Current Switch ALU"; IBM Technical Disclosure Bulletin; vol. 21, No. 12; May 1979; pp. 4808–4810.

Primary Examiner—Edward P. Westin
Assistant Examiner—Benjamin D. Driscoll
Attorney, Agent, or Firm—Peter T. Rutkowski; Richard L. Donoladson; William E. Hiller

[57] ABSTRACT

A method and apparatus for reducing aperture uncertainty and kick-back noise in high speed comparators is disclosed. The disclosed method is used in a comparator for comparing a first signal (INP) and a second signal (INM) and having a track mode and a regenerative mode of operation. The steps of this method are as follows. A first input current representing the first signal is switched through a first output node (OUTP) during the track mode and a second input current representing the second signal is switched through a second output node (OUTM) during the track mode. During the regenerative mode, approximately half of the first input current is switched through the first output node (OUTP) and approximately half of the first input current is switched through the second output node (OUTM). Also during the regenerative mode, approximately half of the second input current is switched through the first output node and approximately half of the second input current is switched through the second output node.

11 Claims, 1 Drawing Sheet

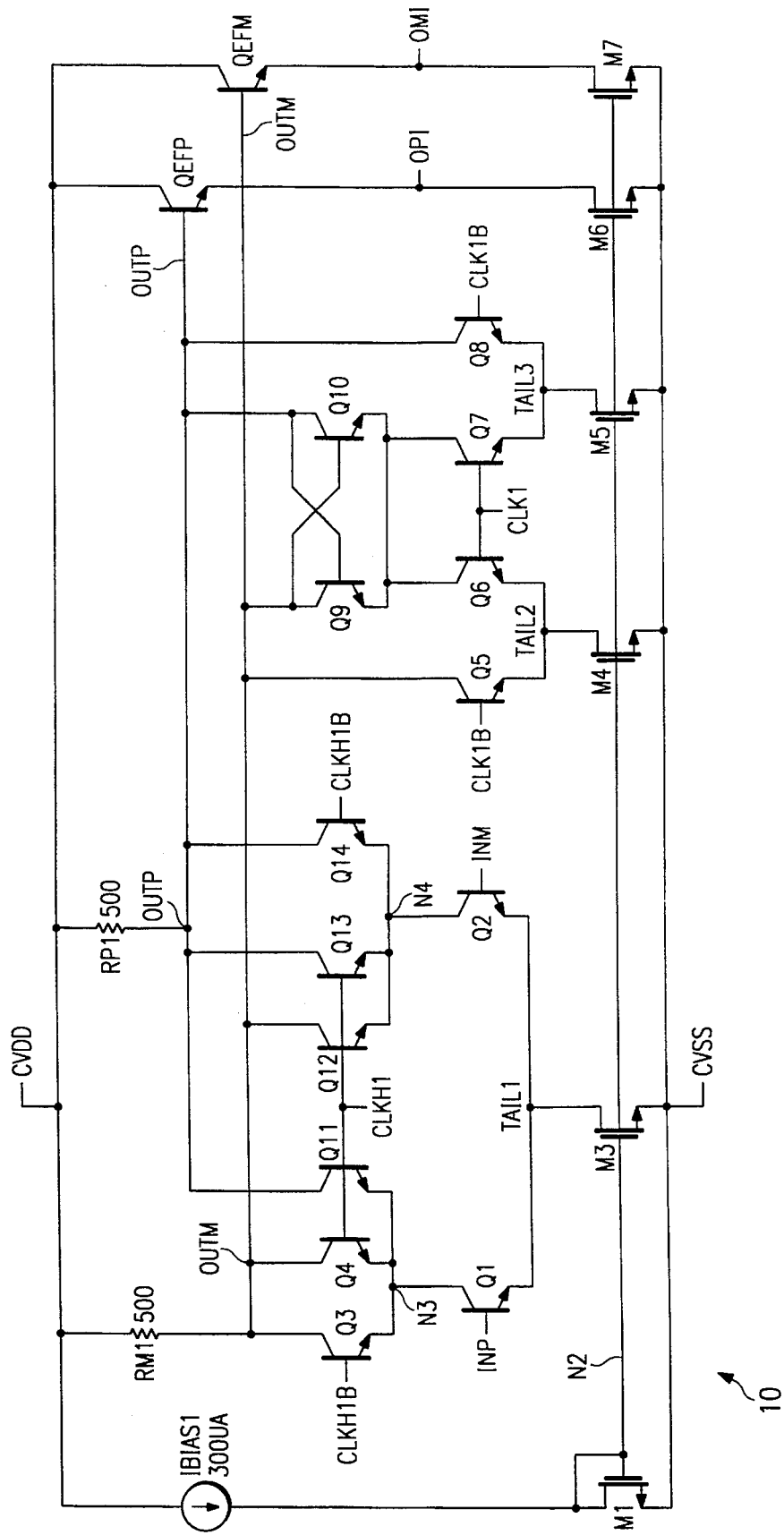

HIGH SPEED COMPARATOR WITH A PRECISE SAMPLING INSTANT

RELATED APPLICATION

This is a continuation-in-part of patent application Ser. No. 08/282,686, filed Jul. 29, 1994, now abandoned.

TECHNICAL FIELD OF THE INVENTION

This invention relates generally to comparators, and more particularly, to a method and apparatus for reducing kick-back noise and aperture uncertainty in high speed comparators.

BACKGROUND OF THE INVENTION

Clocked comparators have two basic modes of operation, a track mode and a regenerative mode. During the track mode, a comparator tracks the input signals and continuously changes its output based upon a comparison of the two inputs. During the transition between the track mode and regenerative mode, the comparator stops tracking and maintains the output voltage based upon a comparison between the two inputs at the time of the transition. This time is also known as the "sampling instant." During the regenerative mode, the comparator maintains the output voltage at a value indicating the result of the comparison made at the sampling instant.

Existing comparators suffer from two major problems. The first problem is "kick-back noise." During the regenerative mode in an ideal comparator, the value of the input voltages should not affect the value of the output voltage. If the input stage of the comparator is not disabled in some way during the regenerative mode, a strong change in the input signal occurring after the sampling instant can cause the output of the comparator to change during the regenerative mode. Various methods have been developed to disable the input stage during the regenerative mode. An existing solution may involve, for example, disabling an input differential pair that is normally present in existing comparators. Disabling the input circuitry, however, causes a sudden variation in the bias currents of the input devices and can cause "glitches" in the source inputs. The comparator, therefore, may disturb the source or sources it is trying to compare. A disturbance caused by disabling of the input stage is known as kick-back noise.

The second major problem with existing comparators is "aperture uncertainty". The sampling instant is normally defined by a clock edge. The comparison, however, normally does not occur simultaneously with the transition of the clock. Rather, there is normally a short delay, known as an aperture delay, before the comparator makes the comparison. In some comparators, there is a large amount of uncertainty as to the length of this delay. In many existing comparators, the aperture delay depends upon the level of the signals the comparator is trying to compare. In other words, when a signal is relatively high, it takes a specific time for the comparison to take place and when the signal is relatively low, it takes another time for the comparison to take place.

There are a number of existing techniques for dealing with aperture uncertainty and/or kick-back noise. These techniques, however, have not been completely successful in reducing aperture uncertainty and kick-back noise. In addition, many of these techniques may not be used in circuits employing a BICMOS or bipolar technology with a low voltage power supply such as a three volt power supply.

SUMMARY OF THE INVENTION

The present invention reduces aperture uncertainty and reduces the problem of kick-back noise in high speed comparators. One aspect of the invention is a method for reducing aperture uncertainty and kick-back noise in a comparator having a track mode and a regenerative mode of operation. During the track mode, a first input current representing a first signal being compared by the comparator is switched through a first output node. Also, during the track mode, a second input current representing the second signal the comparator is comparing is switched through a second output node. During the regenerative mode, approximately half of each of the first input current and the second input current is switched through each output node. This method sends approximately equal currents through each output node during the regenerative mode, preventing the inputs from affecting the outputs during this mode.

An important technical advantage of the present invention is that it reduces aperture uncertainty in high speed comparators. The disclosed method and apparatus also reduces kick-back noise in high speed comparators. The disclosed method and apparatus can be used in technologies employing a low voltage power supply such as a three volt power supply currently used to power existing BICMOS technology comparators. The disclosed invention, then, can be used in both low voltage power supply comparators and higher voltage power supply comparators.

BRIEF DESCRIPTION OF THE DRAWINGS

For a more complete understanding of the present invention, and the advantages thereof, reference is now made to the following descriptions taken in conjunction with the accompanying drawing which illustrates an electrical schematic diagram of a high speed comparator constructed in accordance with the teachings of the present invention.

DETAILED DESCRIPTION OF THE INVENTION

The preferred embodiment of the present invention and its advantages are best understood by referring to the drawing.

The drawing illustrates a high speed comparator indicated generally at 10 and constructed in accordance with the teachings of the present invention. Comparator 10 can have a first output node, OUTM, and a second output node, OUTP. Each output node has a load circuit coupled to the output node. For this embodiment, first output node, OUTM, is connected to load resistor RM1, which can be, for example, a 500 ohm resistor. Similarly, second output node, OUTP, is connected to load resistor RP1 which can be, for example, a 500 ohm resistor. These resistors can be connected between the corresponding output node and CVDD which is a voltage source. In this embodiment, CVDD can be a three volt voltage source. The specific value of the load resistor will depend upon the performance characteristics of the various transistors used in comparator 10.

Comparator 10 has two input stages operable to receive an input signal and produce a current proportional to the magnitude of the input signal. Comparator 10, as illustrated in FIG. 1, is operable to compare two voltages. For this embodiment, the input stages may consist of transistors Q1 and Q2 arranged in a differential pair configuration. The first input terminal, INP is connected to the base of transistor Q1. The second input terminal INM, connects to the base of transistor Q2. These inputs are connected to two sources of voltage (not shown) that the comparator compares against one another.

MOSFET M3 serves as a current source for transistors Q1 and Q2. The emitters of transistors Q1 and Q2 are connected together and also to the drain of MOSFET M3. The source of MOSFET M3 is connected to CVSS, and the gate of MOSFET M3 is connected to current source, IBIAS1. IBIAS1 serves as a current source for the current mirror created with MOSFETs M1, M3, M4, M5, M6 and M7. Current source IBIAS1 is also connected to the gates of MOSFETs M3, M4, M5, M6, and M7 and the drain of MOSFET M1, while the source of each of MOSFETs, M1, M3, M4, M5, M6, and M7 are all connected to CVSS. CVSS, for example, can be connected to circuit.

If two currents are to be compared at inputs INP and INM, rather than two voltages, transistors Q1 and Q2 could be replaced with different circuitry. Suitably controlled input currents could be fed directly to the nodes labeled N3 and N4.

Comparator 10 also includes a switch coupled to each input stage and a corresponding output node to pass the current representative of the corresponding input through the corresponding output node during the track mode in response to a clock signal. In this embodiment, transistor Q3 functions as the switch connecting input INP to output node OUTM. Transistor Q14 functions as the switch connecting input INM to output OUTP. Clock signal CLKH1B, which is supplied by an external clock source (not explicitly shown), connects to the bases of transistors Q3 and Q14 and switches these transistors on during the track mode and off during the regenerative mode. The emitter of transistor Q3 connects to transistor Q1. The collector of transistor Q3 connects to output node OUTM. The emitter of transistor Q14 connects to the collector of transistor Q2. The collector of transistor Q14 connects to output node OUTP.

High speed comparator 10 also includes a shunting circuit associated with each input stage. For a particular input stage, the shunting circuit is operable to pass approximately half of the current representative of the magnitude of the signal at the corresponding input through each output node during the regenerative mode of operation. For example, high speed comparator 10 has two shunting circuits. The first shunting circuit comprises transistors Q4 and Q11 and is controlled by clock signal CLKH1 (not explicitly shown). CLKH1, also externally supplied, is the boolean complement of CLKH1B. The emitters of transistors Q4 and Q11 connect to the collector of transistor Q1. The collector of transistor Q4 connects to output node OUTM while the collector of transistor Q11 connects to output node OUTP. The bases of transistors Q4 and Q11 are connected to clock signal, CLKH1. Preferably, Q4 and Q11 may be designed to have nearly identical device characteristics so that they pass approximately the same amount of current to each respective output node during the regenerative mode.

Preferably, transistors Q12 and Q13 may also be designed to have nearly identical device characteristics. The emitters of transistors Q12 and Q13 connect to the collector of transistor Q2. The bases of transistors Q12 and Q13 connect to clock signal, CLKH1. The collector of transistor Q12 connects to output node OUTM. The collector of transistor Q13 connects to output node OUTP.

Comparator 10 may also have a latch coupled to each output node and operable to store a voltage during the regenerative mode representing a result of a comparison between the voltages at the output nodes at the end of the track mode. In this embodiment, the latch comprises transistors Q9 and Q10. The base of transistor Q9 connects to the collector of transistor Q10, while the base of transistor Q10 connects to the collector of Q9. The collector of transistor Q9 connects to output node OUTM while the collector of Q10 connects to output node OUTP. The emitters of transistors Q9 and Q10 are connected together. Comparator 10 also includes current sources to provide current to the latch during the regenerative mode. MOSFET M4 functions as a first current source and MOSFET M5 functions as a second current source.

Comparator 10 may include a current switcher associated with each current source for the latch and operable to connect the latch to one of the current sources during the regenerative mode, and the current source to one of the output nodes during the track mode. For example, transistors Q5 and Q6 may function as a current switcher in comparator 10. The emitters of transistors Q5 and Q6 connect to the drain of MOSFET M4. The collector of transistor Q5 connects to output node OUTM while the collector of transistor Q6 connects to the emitters of transistors Q9 and Q10—the transistors forming the latch.

Transistor Q5 is switched on during the track mode by clock signal CLK1B and switched off during the regenerative mode. In the illustrated embodiment, clock signal CLK1B has approximately the same frequency and duty cycle characteristics as clock signal CLKH1B. Clock signal CLK1B, however, is biased at a different voltage level than clock signal CLKH1B. The base of transistor Q6 is connected to clock signal CLK1, which is the boolean complement of clock signal CLK1B. Transistor Q6 is controlled by clock signal CLK1 such that transistor Q6 is on during the regenerative mode and off during the track mode.

Similarly, transistors Q7 and Q8 also serve as a current switcher. The emitters of transistors Q7 and Q8 connect to the drain of MOSFET M5. The collector of transistor Q7 connects to the emitters of transistors Q9 and Q10—the transistors functioning as the latch. The collector of transistor Q8 connects to output OUTP. The base of transistor Q8 connects to clock signal CLK1B. The base of transistor Q7 connects to clock signal CLK1. The operation of transistors Q7 and Q8 is as described above for transistors Q6 and Q5, respectively.

comparator 10 also has an output stage for each output comprising an output terminal and a buffer connected between the output node and the output terminal. Here, an emitter follower topology has been used to buffer the outputs. Output node OUTP connects to the base of transistor QEFP. The collector of transistor QEFP connects to CVDD while the emitter of transistor QEFP connects to output terminal OP1 and the drain of MOSFET M6. Output node OUTM connects to the base of transistor QEFM. The collector of transistor QEFM connects to CVDD while the emitter of transistor QEFM connects to output terminal OM1 and the drain of MOSFET M7.

Those skilled in the art will recognize that the maximum frequency of the operation of a transistor varies with the current density through the device. Accordingly, the bias currents should be chosen so that the transistors operate near the maximum frequency of operation.

The theory of the present invention depends upon the switching of current. One of the fastest operations possible in solid state devices is current switching. The disclosed invention depends upon high speed switching of various currents. To reduce aperture uncertainty and kick-back noise, the currents flowing through nodes N3 and N4 and differential pair Q1 and Q2 during the track mode are not cut off. Rather, this current is merely switched to a shunting circuit that divides the current equally between each output node. Because the current is divided equally between each output node, no differential voltage caused by the inputs develops on the output nodes during the regenerative mode.

During the track mode, the comparator compares the relative magnitude of the input voltages at INP and INM. Differential pair Q1 and Q2 generates currents based upon these voltages. During the track mode, transistors Q3 and Q14 are conducting (on) while transistors Q4, Q11, Q12 and Q13 are not conducting (off). The entire current passing through transistors Q1 and Q2 passes directly through the corresponding output nodes through transistors Q3 and Q14. Because differential currents are transferred directly through output nodes OUTM and OUTP, a differential voltage appears between output nodes OUTP and OUTM.

Existing comparators often disable differential pair transistors Q1 and Q2 during the regenerative mode, causing kick-back noise due to the sudden change in currents flowing through Q1 and Q2. This noise sometimes affects the sources that produce the voltages appearing at inputs INP and INM. Rather than disable the differential pair during the regenerative mode, the shunting circuits in comparator 10 shunt the differential current during the regenerative mode. During the regenerative mode, transistors Q3 and Q14 are off while transistors Q4, Q11, Q12, and Q13 are on. Because transistors Q4 and Q11 have virtually identical device characteristics and transistors Q12 and Q13 have virtually identical device characteristics, approximately half of the current flowing through transistor Q1 is shunted to output node OUTM and approximately half of that current is shunted to output node OUTP. Similarly, approximately half of the current flowing through transistor Q2 is shunted to output node OUTM through transistor Q12 and approximately half of that current is shunted to output node OUTP through transistor Q13. Because half of each differential current is shunted to each output node, the differential currents do not affect the differential voltage between output nodes OUTP and OUTM because an equal current is sent to each node during the regenerative mode. Accordingly, changes in the inputs will not affect the output nodes during the regenerative mode.

A similar theory applies to the operation of the latching circuitry that latches a differential voltage during the regenerative mode. During the track mode, transistor Q5 is on and transistor Q6 is off, thus passing the current supplied by MOSFET M4 through output node OUTM. Similarly, during the track mode transistor Q8 is on and transistor Q7 is off, thus directing the current from MOSFET M5 through output node OUTP. Because M4 and M5 are designed to draw nearly identical amounts of current, the differential voltage at output nodes OUTP and OUTM is unaffected by the current flowing through MOSFETs M4 AND M5 during the track mode of operation.

During regenerative mode, the current flows from the latch through transistor Q6 and MOSFET M4. During the regenerative mode, transistor Q6 is on while transistor Q5 is off. Similarly, current flows from the latch through transistor Q7 and MOSFET M5 during the regenerative mode. During the regenerative mode, transistor Q7 is on and transistor Q8 is off. This arrangement prevents glitches at the onset of the regenerative mode as current flow is merely switched from one path to another.

The output terminals, OP1 and OM1, are buffered by transistors QEFP and QEFM which are arranged in an emitter follower configuration as will be readily apparent to those skilled in the art.

The disclosed method and apparatus have many advantages over existing comparators. For example, the comparator reduces the problem of kick-back noise because the input stage of the comparator is not switched off during the regenerative mode. Although the input stage is not switched off, it does not disturb the output nodes during the regenerative mode because the current supplied by the input stage is channeled equally to each output node during the regenerative mode. The comparator also does not suffer from aperture uncertainty problems. The disclosed method and apparatus reduce the dependence of aperture delay upon input signal level. In addition, the disclosed comparator may be used with a technology, such as BICMOS, that requires a low voltage power supply such as a three volt power supply. The invention, however, is not limited to comparators using low voltage power supplies and could be used with high power supply voltage comparators.

Although the present invention has been described in the context of a comparator employing mostly bipolar devices, the invention is not intended to be limited to the use of bipolar transistors or MOSFETs in any portion of the present circuit. The disclosed method and apparatus could employ MOSFETs in place of the bipolar devices or bipolar devices in place of the MOSFETs. Certain changes in the connections between the devices would be necessary, however, as will be readily apparent to those skilled in the art.

Similarly, the present comparator employs NPN bipolar devices. NPN devices have been chosen because they are normally faster than PNP devices. For many applications, extremely high speed comparators are unnecessary and PNP transistors could be used in place of the NPN transistors. Similarly, either N type or P type MOSFETs could be employed without departing from the scope of the present invention.

The disclosed invention can be used in any application in which comparators are used. For example, the disclosed comparator could be employed in an analog-to-digital converter or a phase detector. Other applications will readily be apparent to those of ordinary skill in the art.

Although the present invention and its advantages have been described in detail, it should be understood that various changes, substitutions and alterations can be made therein without departing from the spirit and scope of the invention as defined by the appended claims.

What is claimed is:

1. A comparator having a track mode of operation and a regenerative mode of operation comprising:

a first output node;

a second output node;

a first input stage operable to receive a first input signal and produce a first current proportional to the magnitude of the first input signal;

a second input stage operable to receive a second input signal and produce a second current proportional to the magnitude of the second input signal;

a first switch coupled to said first input stage and said first output node, said first switch operable to pass said first current through said first output node during the track mode in response to a clock signal;

a second switch coupled to said second input stage and said second output node, said second switch operable to pass said second current through said second output node during the track mode in response to said clock signal;

a first shunting circuit coupled to the first input stage, the first output node, and the second output node, said first shunting circuit operable to pass approximately half of said first current through said first output node and approximately half of said first current through said second output node during the regenerative mode in response to said clock signal; and a second shunting circuit coupled to said second input stage, said first output node, and said second output node, said second shunting circuit operable to pass approximately half of said second current through said first output node and approximately half of said second current through said second output node during the regenerative mode in response to said clock signal.

2. The comparator of claim 1, further comprising:

a current source, wherein said first input stage includes a first input terminal operable to receive said first input signal, said first input terminal coupled to the base of a first input transistor, said first input transistor further coupled between said current source and said first switch; and wherein said second input stage includes a second input terminal operable to receive said second input signal, said second input terminal coupled to the base of a second input transistor, said second input transistor further coupled to said current source and said second switch.

3. The comparator of claim 1, wherein said first switch further comprises a first switch transistor including a first base coupled to said clock signal, said first switch transistor further coupled between said first input stage and said first output node, said first switch transistor operable to pass said first current through said first output node during the track mode of operation in response to said clock signal; and wherein said second switch further comprises a second switch transistor including a second base coupled to said clock signal, said second switch transistor further coupled between said second input stage, and said second output node, said second switch transistor operable to pass said second current through said second output node during the track mode of operation in response to said clock signal.

4. The comparator of claim 1, wherein said first shunting circuit further comprises a first shunt transistor including a first base coupled to an inverse of said clock signal, said first shunt transistor further coupled between said first input stage and said first output node, said first shunt transistor operable to pass approximately half of said first current through said first output node during the regenerative mode of operation, and a second shunt transistor including a second base coupled to said inverse of the clock signal, said second shunt transistor further coupled between said first input stage, and said second output node, said second shunt transistor operable to pass approximately half of said first current through said second output node during the regenerative mode of operation.

5. The comparator of claim 1, wherein said first shunting circuit further comprises a first shunt transistor including a first base coupled to an inverse of said clock signal, said first shunt transitor further coupled between said first input stage and said first output node, said first shunt transistor operable to pass approximately half of said first current through said first output node during the regenerative mode of operation, and a second shunt transistor including a second base coupled to said inverse of the clock signal, said second shunt transistor further coupled between said first input stage and said second output node, said second shunt transistor operable to pass approximately half of said first current through said second output node during the regenerative mode of operation; and wherein said second shunting circuit further comprises a third shunt transistor including a third base coupled to said inverse of said clock signal, said third shunt transistor further coupled between said second input stage and said first output node, said third shunt transistor operable to pass approximately half of said second current through said first output node during the regenerative mode of operation, and a fourth shunt transistor including a fourth base coupled to said inverse of the clock signal, said second shunt transistor further coupled between said second input stage and said second output node, said second shunt transistor operable to pass approximately half of said second current through said second output node during the regenerative mode of operation.

6. The comparator of claim 5 wherein said first switch further comprises a first switch transistor including a fifth base coupled to said clock signal, said first switch transistor further coupled between said first input stage and said first output node, said first switch transistor operable to pass said first current through said first output node during the track mode of operation in response to said clock signal; and wherein said second switch further comprises a second switch transistor including a sixth base coupled to said clock signal, said second switch transistor further coupled between said second input stage, and said second output node, said second switch transistor operable to pass said second current through said second output node during the track mode of operation in response to said clock signal.

7. The comparator of claim 5 further comprising:

a current source, wherein said first input stage includes a first input terminal operable to receive said first input signal, said first input terminal coupled to the base of a first input transistor, said first input transistor further coupled between said current source and said first switch; and wherein said second input stage includes a second input terminal operable to receive said second input signal, said second input terminal coupled to the base of a second input transistor, said second input transistor further coupled to said current source and said second switch.

8. A method for reducing aperture uncertainty and kickback noise in a comparator for comparing a first signal and a second signal and having both a track and a regenerative mode of operation, comprising the steps of:

switching a first input current representing the first signal through a first output node during the track mode;

switching a second input current representing the second signal through a second output node during the track mode;

switching approximately half of the first input current through the first output node and approximately half of the first input current through the second output node during the regenerative mode; and switching approximately half of the second input current through the first output node and approximately half of the second input current through the second output node during the regenerative mode.

9. The method of claim 8 and further comprising the step of:

latching the voltage differential between the first output node and the second output node at the beginning of the regenerative mode.

10. The method of claim 8 wherein said switching steps are accomplished using bipolar transistors as switches.

11. The method of claim 8 wherein said switching steps are accomplished using field effect transistors as switches.

* * * * *